United States Patent
Zhao et al.

(10) Patent No.: US 11,894,374 B2
(45) Date of Patent: Feb. 6, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Wenli Zhao, Hefei (CN); Jie Bai, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 66 days.

(21) Appl. No.: 17/648,314

(22) Filed: Jan. 19, 2022

(65) Prior Publication Data
US 2023/0015200 A1    Jan. 19, 2023

Related U.S. Application Data

(63) Continuation of application No. PCT/CN2021/117419, filed on Sep. 9, 2021.

(30) Foreign Application Priority Data

Jul. 19, 2021    (CN) .......................... 202110813115.2

(51) Int. Cl.
*H01L 27/092* (2006.01)
*H01L 21/8238* (2006.01)

(52) U.S. Cl.
CPC .. *H01L 27/0922* (2013.01); *H01L 21/823842* (2013.01); *H01L 21/823864* (2013.01); *H01L 27/092* (2013.01)

(58) Field of Classification Search
CPC . H01L 21/8238–823892; H01L 27/092; H01L 27/0922
See application file for complete search history.

(56) References Cited

U.S. PATENT DOCUMENTS

| | | | |
|---|---|---|---|
| 2003/0049906 A1* | 3/2003 | Graf ................ | H01L 21/823871 257/E21.654 |
| 2003/0203560 A1 | 10/2003 | Ryu et al. | |
| 2004/0023478 A1* | 2/2004 | Samavedam ... | H01L 21/823864 257/E21.64 |

(Continued)

FOREIGN PATENT DOCUMENTS

| | | | |
|---|---|---|---|
| CN | 103794483 A | 5/2014 |
| CN | 104124156 A | 10/2014 |
| CN | 106129005 A | 11/2016 |

OTHER PUBLICATIONS

International Search Report cited in PCT/CN2021/117419 dated Apr. 20, 2022, 9 pages.

(Continued)

*Primary Examiner* — Bryan R Junge
(74) *Attorney, Agent, or Firm* — Cooper Legal Group, LLC

(57) ABSTRACT

The present disclosure relates to the technical field of semiconductors, and provides a semiconductor structure and a manufacturing method thereof. The semiconductor structure includes a substrate, an NMOS transistor, and a PMOS transistor. The NMOS transistor includes a first dielectric layer, a first work function layer, and a first conductive layer that are stacked in sequence. The PMOS transistor includes a second dielectric layer, a second work function layer, and a second conductive layer that are stacked in sequence.

17 Claims, 11 Drawing Sheets

(56) References Cited

U.S. PATENT DOCUMENTS

| | | | |
|---|---|---|---|
| 2004/0211999 A1* | 10/2004 | Yamamoto | H10B 41/49 257/E21.198 |
| 2007/0052037 A1* | 3/2007 | Luan | H01L 21/823842 257/E29.151 |
| 2007/0155073 A1* | 7/2007 | Goktepeli | H01L 21/823814 257/E21.633 |
| 2009/0096032 A1* | 4/2009 | Saitoh | H01L 21/823871 438/294 |
| 2009/0108356 A1* | 4/2009 | Cheng | H01L 27/105 257/E29.264 |
| 2011/0070702 A1* | 3/2011 | Chien | H01L 29/7843 257/E21.639 |
| 2012/0032332 A1 | 2/2012 | Lim et al. | |
| 2013/0320410 A1* | 12/2013 | Lin | H01L 29/4966 257/288 |
| 2020/0350213 A1 | 11/2020 | Ramkumar et al. | |
| 2021/0407862 A1* | 12/2021 | More | H01L 21/32132 |

OTHER PUBLICATIONS

Leroux, et al., "Investigating Doping Effects on High-J Metal Gate Stack for Effective Work Function Engineering", Solid-State Electronics 88 (2013) 21-26, 6 pages.

Sivanaresh M., et al., "Analysis and Modeling of the Narrow Width Effect in Gate-First HKMG nMOS Transistors", IEEE Transactions On Electron Devices, vol. 62, No. 4, Apr. 2015, 8 pages.

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2021/117419, filed on Sep. 9, 2021, which claims the priority to Chinese Patent Application 202110813115.2, titled "SEMICONDUCTOR STRUCTURE AND MANUFACTURING METHOD THEREOF" and filed on Jul. 19, 2021. The entire contents of International Application No. PCT/CN2021/117419 and Chinese Patent Application 202110813115.2 are incorporated herein by reference.

TECHNICAL FIELD

The present disclosure relates to, but is not limited to, a semiconductor structure and a manufacturing method thereof.

BACKGROUND

In the manufacturing process of dynamic random access memory (DRAM), the high-k metal gate (HKMG) technology has been applied in the peripheral region to achieve the high performance requirement of reducing the equivalent oxide thickness (EOT) and leakage of the device. However, the high-k material has many internal defects that make it difficult to directly adjust the threshold voltage of the device by conventional ion implantation. A work function layer is introduced in the related art for adjustment. However, due to structural constraints, the work function layer itself will cause a series of problems, affecting the device performance.

SUMMARY

The present disclosure provides a semiconductor structure and a manufacturing method thereof.

According to a first aspect of the present disclosure, a semiconductor structure is provided, including a substrate, and an N-channel metal-oxide semiconductor (NMOS) transistor and a P-channel metal-oxide semiconductor (PMOS) transistor that are located on the substrate, where the NMOS transistor includes:

a first dielectric layer, located on the substrate;

a first work function layer, located on the first dielectric layer; and a first conductive layer, located on the first work function layer;

the PMOS transistor includes:

a second dielectric layer, located on the substrate;

a second work function layer, located on the second dielectric layer; and a second conductive layer, located on the second work function layer;

wherein the first work function layer is provided with a first sidewall isolation layer on a side facing the second work function layer, and/or the second work function layer is provided with a second sidewall isolation layer on a side facing the first work function layer.

According to a second aspect of the present disclosure, a method of manufacturing a semiconductor structure is provided, including:

providing a substrate, wherein an isolation structure is formed in the substrate to separate a first active region and a second active region;

forming a dielectric layer, wherein the dielectric layer above the first active region is used as a first dielectric layer, and the dielectric layer above the second active region is used as a second dielectric layer, and forming a first initial work function layer on the second dielectric layer;

forming a first sidewall isolation layer on a side of the first dielectric layer close to the second dielectric layer, and/or forming a second sidewall isolation layer on a sidewall of the first initial work function layer close to the first dielectric layer;

forming a second initial work function layer, wherein the second initial work function layer on the first dielectric layer is used as a first work function layer, the first initial work function layer and the second initial work function layer on the first initial work function layer are used as a second work function layer; and forming a conductive layer, wherein the conductive layer on the first work function layer is used as a first conductive layer, and the conductive layer on the second work function layer is used as a second conductive layer.

BRIEF DESCRIPTION OF THE DRAWINGS

The preferred embodiments of the present disclosure are described in detail below with reference to the accompanying drawings to make the objectives, features and advantages of the present disclosure more obvious. The drawings are merely exemplary illustrations of the present disclosure, and are not necessarily drawn to scale. The same reference numerals in the drawings always represent the same parts. In the drawings.

DETAILED DESCRIPTION

Figure 1:
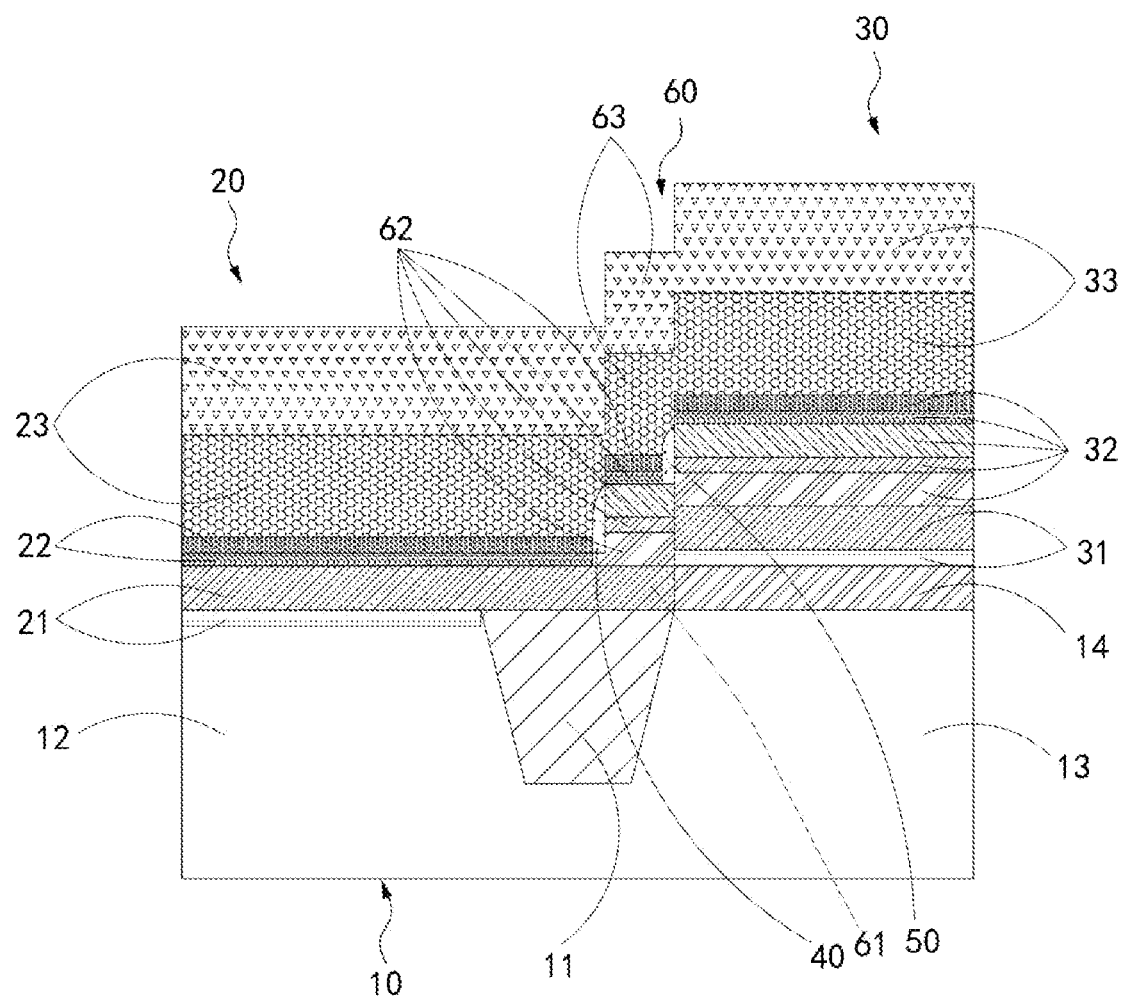
FIG. 1 is a schematic structural diagram of a semiconductor structure according to an exemplary embodiment.

The typical embodiments embodying the features and advantages of the present disclosure are described in detail below. It should be understood that the present disclosure may have various changes in different embodiments, which do not depart from the scope of the present disclosure. The description and drawings herein are essentially used for the purpose of explanation, rather than limiting the present disclosure.

Different exemplary embodiments of the present disclosure are described below with reference to the accompanying drawings. The accompanying drawings form a part of the present disclosure, which show by way of example different exemplary structures, systems and steps that can implement various aspects of the present disclosure. It should be understood that other specific solutions of components, structures, exemplary devices, systems and steps may be used, and structural and functional modifications may be made without departing from the scope of the present disclosure. Moreover, although the terms such as "above", "between" and "within" may be used in this specification to describe different exemplary features and elements of the present disclosure, these terms are used herein only for convenience of description, for example, according to the directions of the examples in the drawings. Nothing in this specification should be understood as requiring a specific three-dimensional direction of the structure to fall within the scope of the present disclosure.

An embodiment of the present disclosure provides a semiconductor structure. Referring to FIG. 1, the semiconductor structure includes a substrate 10, and an NMOS transistor 20 and a PMOS transistor 30 that are located on the substrate 10. The NMOS transistor 20 includes: a first dielectric layer 21 located on the substrate 10, a first work function layer 22 located on the first dielectric layer 21, and a first conductive layer 23 located on the first work function layer 22. The PMOS transistor 30 includes: a second dielectric layer 31 located on the substrate 10, a second work function layer 32 located on the second dielectric layer 31, and a second conductive layer 33 located on the second work function layer 32. The first work function layer 22 is arranged with a first sidewall isolation layer 40 on a side facing the second work function layer 32, and/or the second work function layer 32 is arranged with a second sidewall isolation layer 50 on a side facing the first work function layer 22.

The semiconductor structure according to an embodiment of the present disclosure includes a substrate 10, an NMOS transistor 20, and a PMOS transistor 30. The NMOS transistor 20 includes a first dielectric layer 21, a first work function layer 22, and a first conductive layer 23 that are stacked in sequence. The PMOS transistor 30 includes a second dielectric layer 31, a second work function layer 32, and a second conductive layer 33 that are stacked in sequence. The first work function layer 22 and the second work function layer 32 can adjust the work functions of the NMOS transistor 20 and the PMOS transistor 30 respectively. However, in the manufacturing process of the semiconductor structure, metal elements in the first work function layer 22 and the second work function layer 32 will be diffused, which may affect adjustment of the threshold voltage of the semiconductor structure. By providing the first sidewall isolation layer 40 on the side of the first work function layer 22 facing the second work function layer 32, and/or providing the second sidewall isolation layer 50 on the side of the second work function layer 32 facing the first work function layer 22, cross diffusion of the metal elements can be prevented, so as to avoid hard adjustment on the threshold voltage of the semiconductor structure, thereby improving the performance of the semiconductor structure.

The semiconductor structure in this embodiment is a complementary metal oxide semiconductor (CMOS) transistor, which includes an NMOS transistor 20 and a PMOS transistor 30, wherein the NMOS transistor 20 and the PMOS transistor 30 are independent of each other.

As shown in FIG. 1, an isolation structure 11 is formed in the substrate 10, so as to separate a first active region 12 and a second active region 13 in the substrate 10 for the NMOS transistor 20 and the PMOS transistor 30 respectively. The first dielectric layer 21 of the NMOS transistor 20 is formed on the first active region 12, and the second dielectric layer 31 of the PMOS transistor 30 is formed on the second active region 13. The isolation structure 11 may include silicon oxide, silicon nitride, silicon nitrides, fluorosilicate glass (FSG), a low-k dielectric material, and other suitable materials or combinations of these materials.

The isolation structure 11 may define the first active region 12 and the second active region 13 by using an isolation technology, and implement electrical isolation between the first active region 12 and the second active region 13. The isolation technology may be, for example, a Local Oxidation of Silicon (LOCOS) or shallow trench isolation (STI) technology.

The number of films of the first work function layer 22 may be less than the number of films of the second work function layer 32. Alternatively, the number of films of the first work function layer 22 is equal to the number of films of the second work function layer 32.

In an embodiment, the substrate 10 may include a silicon carbide substrate, a sapphire substrate, or a silicon substrate. In an embodiment, the substrate 10 may be made of any suitable material, including, for example, at least one from the group consisting of silicon, monocrystalline silicon, polysilicon, amorphous silicon, silicon-germanium, monocrystalline silicon-germanium, polycrystalline silicon-germanium, or carbon-doped silicon.

The first dielectric layer 21 may be a single-layer structure or a multi-layer structure. In this embodiment, the first dielectric layer 21 may include an interface layer 70 and a high-k dielectric layer 71 that are stacked in sequence. The interface layer 70 may include a silicon oxide layer. The material of the high-k dielectric layer 71 may include, for example, hafnium oxide, hafnium oxide silicon, lanthanum oxide, lanthanum aluminum oxide, zirconium oxide, zirconium oxide silicon, tantalum oxide, tantalum oxide silicon, titanium oxide, barium strontium titanium oxide, barium titanium oxide, strontium titanium oxide, yttrium oxide, aluminum oxide, silicon oxide, lead scandium tantalum oxide and lead zinc niobate.

The first work function layer 22 may be a single-layer structure or a multi-layer structure. The first work function layer 22 may include scandium (Sc), yttrium (Y), actinium (Ac), hafnium (Hf), titanium (Ti), zirconium (Zr), tantalum (Ta), aluminum (Al), lanthanum (La), a lanthanide element, an actinide element, and the like. In this embodiment, the first work function layer 22 may include a second transition metal layer 77 and a barrier layer 78 that are stacked in sequence. The second transition metal layer 77 may include lanthanum (La), and the barrier layer 78 may include titanium nitride (TiN).

The first conductive layer 23 may be a single-layer structure or a multi-layer structure. In this embodiment, the first conductive layer 23 may include a polysilicon layer 79 and a metal layer 80 that are stacked in sequence. The metal layer 80 may include conventional conductive metal such as tungsten (W) or copper (Cu).

Correspondingly, the second dielectric layer 31 may be a single-layer structure or a multi-layer structure. In this embodiment, the first dielectric layer 21 may include an interface layer 70 and a high-k dielectric layer 71 that are stacked in sequence.

The second work function layer 32 may be a single-layer structure or a multi-layer structure. The second work function layer 32 may include scandium (Sc), yttrium (Y), actinium (Ac), hafnium (Hf), titanium (Ti), zirconium (Zr), tantalum (Ta), aluminum (Al), lanthanum (La), a lanthanide element, an actinide element, and the like. In this embodiment, first work function layer 22 may include a stop layer 72, a first transition metal layer 73, a metal isolation layer 74, a second transition metal layer 77, and a barrier layer 78 that are stacked in sequence. The stop layer 72 may include titanium nitride (TiN), the first transition metal layer 73 may include aluminum (Al), and the metal isolation layer 74 may include titanium nitride (TiN).

The second conductive layer 33 may be a single-layer structure or a multi-layer structure. In this embodiment, the second conductive layer 33 may include a polysilicon layer 79 and a metal layer 80 that are stacked in sequence.

The first sidewall isolation layer 40 and the second sidewall isolation layer 50 are each an oxide layer, such as a silicon oxide layer, a silicon oxynitride layer, and the like.

In an embodiment, the first sidewall isolation layer 40 and the second sidewall isolation layer 50 are spaced apart. That is, the first sidewall isolation layer 40 and the second sidewall isolation layer 50 independently cover the first work function layer 22 and the second work function layer 32 respectively, to avoid diffusion of metal elements.

A sidewall on a side of the first work function layer 22 facing the second work function layer 32 is a first sidewall, the entire first sidewall may be provided with the first sidewall isolation layer 40, or the first sidewall may be partially arranged with the first sidewall isolation layer 40, that is, the first sidewall isolation layer 40 is provided on at least a part of the first sidewall.

Correspondingly, a sidewall on a side of the second work function layer 32 facing the first work function layer 22 is a second sidewall, and the second sidewall isolation layer 50 is provided on at least a part of the second sidewall.

In an embodiment, the first sidewall isolation layer 40 has a width of 3 nm to 5 nm, and the second sidewall isolation layer 50 has a width of 3 nm to 5 nm. The heights of the first sidewall isolation layer 40 and the second sidewall isolation layer 50 are not limited.

In an embodiment, the first sidewall isolation layer 40 is located below the second sidewall isolation layer 50, that is, the first sidewall isolation layer 40 and the second sidewall isolation layer 50 form a large-size block in a height direction, which can increase the area for blocking diffusion.

The top of the first sidewall isolation layer 40 may be flush with the bottom of the second sidewall isolation layer 50, or the top of the first sidewall isolation layer 40 may be located below the bottom of the second sidewall isolation layer 50.

In an embodiment, the bottom of the first sidewall isolation layer 40 is higher than the bottom of the first work function layer 22, that is, the first sidewall isolation layer 40 covers a part of the first sidewall of the first work function layer 22, such that the part of the first work function layer 22 close to the first dielectric layer 21 is not covered. Specifically, the first sidewall isolation layer 40 covers the barrier layer 78 of the first work function layer 22, but may not cover the second transition metal layer 77 of the first work function layer 22.

In an embodiment, the top of the first sidewall isolation layer 40 is higher than the top of the first work function layer 22, so as to cover a sidewall of the first conductive layer 23, that is, a part of the first sidewall isolation layer 40 may cover the polysilicon layer 79 of the first conductive layer 23.

In an embodiment, the bottom of the second sidewall isolation layer 50 is higher than the bottom of the second work function layer 32, that is, the second sidewall isolation layer 50 covers a part of the second sidewall of the second work function layer 32, such that the part of the second work function layer 32 close to the second dielectric layer 31 is not covered by the second sidewall isolation layer 50.

In an embodiment, the top of the second sidewall isolation layer 50 is lower than the top of the second work function layer 32, that is, the part of the second work function layer 32 close to the second conductive layer 33 is not covered by the second sidewall isolation layer 50.

Specifically, the second sidewall isolation layer 50 covers a part of the stop layer 72, the first transition metal layer 73, and the metal isolation layer 74 of the first work function layer 22.

In an embodiment, neither the NMOS transistor 20 nor the PMOS transistor 30 covers the isolation structure 11.

In an embodiment, at least one of the NMOS transistor 20 and the PMOS transistor 30 covers a part of the isolation structure 11. In this embodiment, as shown in FIG. 1, the first dielectric layer 21 of the NMOS transistor 20 may be directly covered on the isolation structure 11.

In an embodiment, as shown in FIG. 1, the semiconductor structure further includes: an isolation stacked structure 60. The isolation stacked structure 60 is located above the isolation structure 11, and is located between the NMOS transistor 20 and the PMOS transistor 30. The first sidewall isolation layer 40 is located between the NMOS transistor 20 and the isolation stacked structure 60, and/or, the second sidewall isolation layer 50 is located between the PMOS transistor 30 and the isolation stacked structure 60. The first sidewall isolation layer 40 and the second sidewall isolation layer 50 not only can prevent the cross diffusion of metal elements in the first work function layer 22 and the second work function layer 32, but also can prevent metal elements in the isolation stacked structure 60 from diffusing to the NMOS transistor 20 and the PMOS transistor 30.

In an embodiment, as shown in FIG. 1, the isolation stacked structure 60 includes: a third dielectric layer 61 located on the isolation structure 11, a third work function layer 62 located on the third dielectric layer 61, and a third conductive layer 63 located on the third work function layer 62, wherein the first sidewall isolation layer 40 covers a sidewall of the third work function layer 62, and the second sidewall isolation layer 50 covers a sidewall of the third work function layer 62. In the manufacturing process of the semiconductor structure, metal elements in the work function layer are most likely to diffuse. Therefore, in this embodiment, the first sidewall isolation layer 40 is clamped between the first work function layer 22 and the third work function layer 62, and the second sidewall isolation layer 50 is clamped between the second work function layer 32 and the third work function layer 62, to effectively avoid metal diffusion.

The third dielectric layer 61 may be a single-layer structure or a multi-layer structure. In this embodiment, the third dielectric layer 61 may include a high-k dielectric layer 71.

The third work function layer 62 may be a single-layer structure or a multi-layer structure. The third work function layer 62 may include scandium (Sc), yttrium (Y), actinium (Ac), hafnium (Hf), titanium (Ti), zirconium (Zr), tantalum (Ta), Al (Al), lanthanum (La), a lanthanide element, an actinide element, and the like. In this embodiment, the third work function layer 62 may include a stop layer 72, a first transition metal layer 73, a metal isolation layer 74, a second transition metal layer 77, and a barrier layer 78 that are stacked in sequence.

The third conductive layer 63 may be a single-layer structure or a multi-layer structure. In this embodiment, the third conductive layer 63 may include a polysilicon layer 79 and a metal layer 80 that are stacked in sequence.

In an embodiment, the bottom of the first sidewall isolation layer 40 is higher than the bottom of the third work function layer 62, and the top of the first sidewall isolation layer 40 is lower than the top of the third work function layer 62.

In an embodiment, the bottom of the second sidewall isolation layer 50 is higher than the bottom of the third work function layer 62, and the top of the second sidewall isolation layer 50 is higher than the top of the third work function layer 62, to cover a sidewall of the third conductive layer 63.

Specifically, the first sidewall isolation layer 40 and the second sidewall isolation layer 50 cover the opposite sidewalls of the third work function layer 62 respectively, and the first sidewall isolation layer 40 and the second sidewall isolation layer 50 are stacked in sequence in a vertical direction. Therefore, a large coverage area is formed in the vertical direction. The first sidewall isolation layer 40 may cover a part of the stop layer 72, the first transition metal layer 73, and the metal isolation layer 74 of the third work function layer 62. The second sidewall isolation layer 50 may cover the second transition metal layer 77, the barrier layer 78 of the third work function layer 62, and a part of the polysilicon layer 79. The first sidewall isolation layer 40 and the second sidewall isolation layer 50 block the diffusion of the first transition metal layer 73 and the second transition metal layer 77 of the third work function layer 62 to the NMOS transistor 20 and the PMOS transistor 30, such that metal elements are diffused to the isolation structure 11 first.

In an embodiment, the NMOS transistor 20 and the PMOS transistor 30 are both connected to the isolation stacked structure 60, to reduce processes, such that both the NMOS transistor 20 and the PMOS transistor 30 can be synchronously formed with the isolation stacked structure 60.

In an embodiment, the substrate 10 is a stepped structure. That is, the upper surface of the substrate 10 has different heights. In this embodiment, a first upper surface corresponding to the first active region 12 is lower than a second upper surface corresponding to the second active region 13, the first dielectric layer 21 is located on the first upper surface, and the second dielectric layer 31 is located on the second upper surface. It should be noted that, a part of the first dielectric layer 21 and a part of the second dielectric layer 31 may be located in the substrate 10.

In an embodiment, the substrate 10 corresponding to the second active region 13 includes a SiGe layer 14. The SiGe layer 14 forms the second upper surface. The NMOS transistor 20 uses Si as a trench, while the isolation stacked structure 60 uses SiGe as a trench.

Considering that the substrate 10 is a stepped structure, the top of the second dielectric layer 31 is higher than the top of the first dielectric layer 21.

In an embodiment, the upper surface of the substrate 10 may be a plane. In this case, the height of the first dielectric layer 21 may be lower than the height of the second dielectric layer 31, such that the NMOS transistor 20 and the PMOS transistor 30 form a stepped structure.

In an embodiment, the upper surface of the substrate 10 may be a plane. In this case, the height of the first dielectric layer 21 may be equal to the height of the second dielectric layer 31, while the height of the first work function layer 22 is lower than the height of the second work function layer 32, such that the NMOS transistor 20 and the PMOS transistor 30 form a stepped structure.

In an embodiment, the upper surface of the substrate 10 may be a plane. In this case, the height of the first dielectric layer 21 may be equal to the height of the second dielectric layer 31, the height of the first work function layer 22 may be equal to the height of the second work function layer 32, while the height of the first conductive layer 23 is lower than the height of the second conductive layer 33, such that the NMOS transistor 20 and the PMOS transistor 30 form a stepped structure.

It should be noted that, the NMOS transistor 20 and the PMOS transistor 30 form a stepped structure. In this embodiment, the substrate 10 is a stepped structure, while the height of the first dielectric layer 21 may be equal to the height of the second dielectric layer 31, the height of the first work function layer 22 is lower than the height of the second work function layer 32, and the height of the first conductive layer 23 is equal to the height of the second conductive layer 33.

In an embodiment, the NMOS transistor 20, the isolation stacked structure 60, and the PMOS transistor 30 form a stepped structure. The substrate 10 may be a stepped structure, the height of the second work function layer 32 may be equal to the height of the third work function layer 62.

Figure 2:
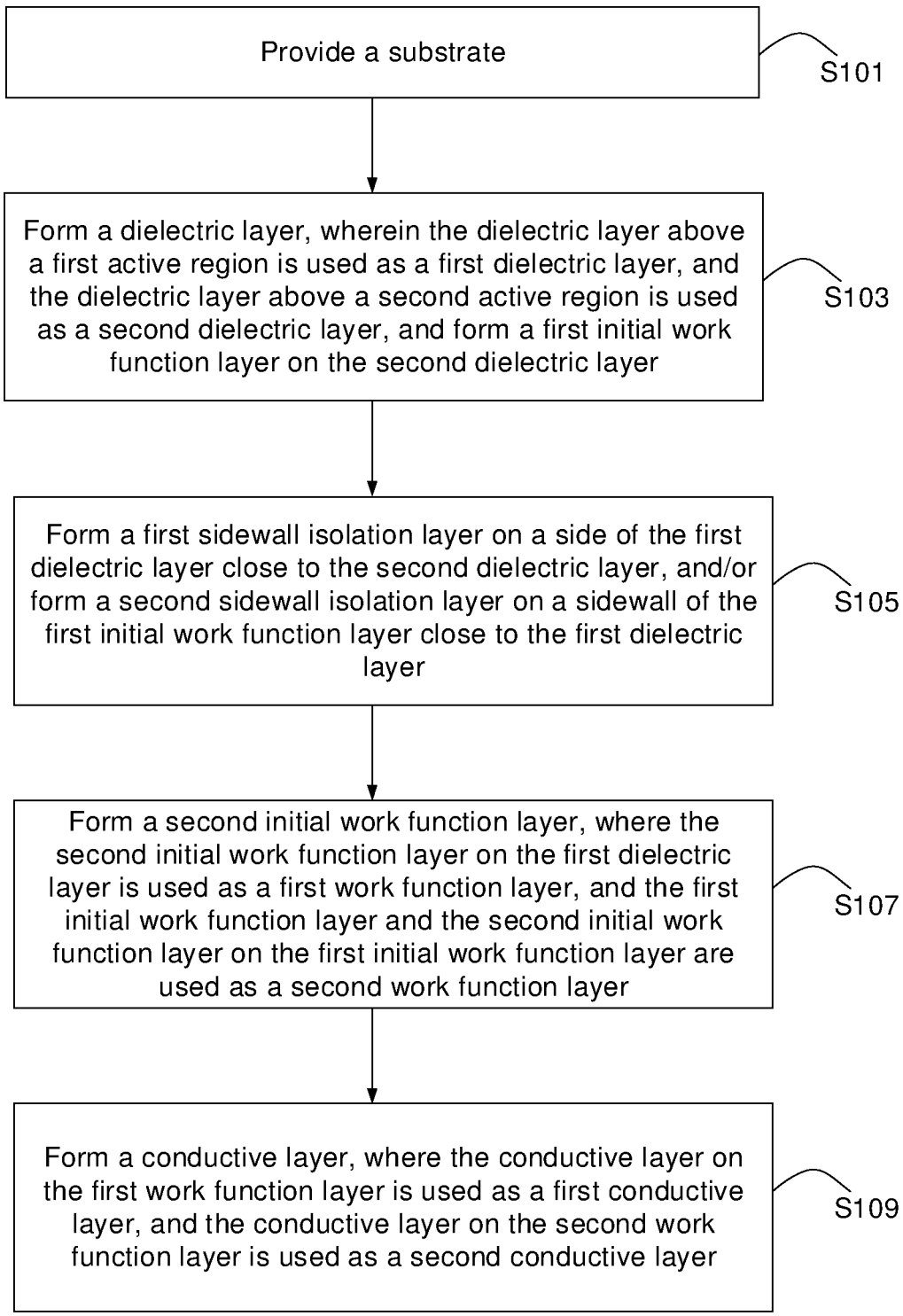
FIG. 2 is a schematic flowchart of a method of manufacturing a semiconductor structure according to an exemplary embodiment.

An embodiment of the present disclosure further provides a method of manufacturing a semiconductor structure. Referring to FIG. 2, the manufacturing method includes the following steps:

S101: Provide a substrate 10, wherein an isolation structure 11 is formed in the substrate 10 to separate a first active region 12 and a second active region 13.

S103: Form a dielectric layer, wherein the dielectric layer above the first active region 12 is used as a first dielectric layer 21, and the dielectric layer above the second active region 13 is used as a second dielectric layer 31, and form a first initial work function layer on the second dielectric layer 31.

S105: Form a first sidewall isolation layer 40 on a side of the first dielectric layer 21 close to the second dielectric layer 31, and/or form a second sidewall isolation layer 50 on a sidewall of the first initial work function layer close to the first dielectric layer 21.

S107: Form a second initial work function layer, wherein the second initial work function layer on the first dielectric layer 21 is used as a first work function layer 22, and the first initial work function layer and the second initial work function layer on the first initial work function layer are used as a second work function layer 32.

S109: Form a conductive layer, wherein the conductive layer on the first work function layer 22 is used as a first conductive layer 23, and the conductive layer on the second work function layer 32 is used as a second conductive layer 33.

In the method of manufacturing a semiconductor structure according to an embodiment of the present disclosure, an NMOS transistor 20 and a PMOS transistor 30 are formed on a substrate 10. The NMOS transistor 20 includes a first dielectric layer 21, a first work function layer 22, and a first conductive layer 23 that are formed in sequence. The PMOS transistor 30 includes a second dielectric layer 31, a second work function layer 32, and a second conductive layer 33 that are formed in sequence. By providing the first sidewall isolation layer 40 on the side of the first work function layer 22 facing the second work function layer 32, and/or providing the second sidewall isolation layer 50 on the side of the second work function layer 32 facing the first work function layer 22, cross diffusion of the metal elements can be prevented, so as to avoid hard adjustment on the threshold voltage of the semiconductor structure, thereby improving the performance of the semiconductor structure.

It should be noted that, the first sidewall isolation layer 40 is formed after the first dielectric layer 21 and before the first work function layer 22. The second sidewall isolation layer 50 is formed in the process of forming the second work function layer 32, to ensure that the first sidewall isolation layer 40 and the second sidewall isolation layer 50 can achieve a blocking function in the process of forming the first work function layer 22 and the second work function layer 32, thereby avoiding massive diffusion of metal to affect the performance of the semiconductor structure.

Specifically, the formation of the second work function layer 32 includes the sequential formation of the first initial work function layer and the second initial work function layer; in addition, the first sidewall isolation layer 40 and the second sidewall isolation layer 50 are formed after the formation of the first initial work function layer and before the formation of the second initial work function layer. Therefore, massive diffusion of metal in the first initial work function layer can be avoided during formation of the second initial work function layer.

It should be noted that, the dielectric layer formed on the substrate 10 is used as the first dielectric layer 21 of the NMOS transistor 20, the second dielectric layer 31 of the PMOS transistor 30, and the third dielectric layer 61 of the isolation stacked structure 60. The second initial work function layer formed above the substrate 10 is used as the first work function layer 22 of the NMOS transistor 20, a part of the second work function layer 32 of the PMOS transistor 30, and a part of the third work function layer 62 of the isolation stacked structure 60. The conductive layer formed above the substrate 10 is used as the first conductive layer 23 of the NMOS transistor 20, the second conductive layer 33 of the PMOS transistor 30, and the third conductive layer 63 of the isolation stacked structure 60.

Figure 3:
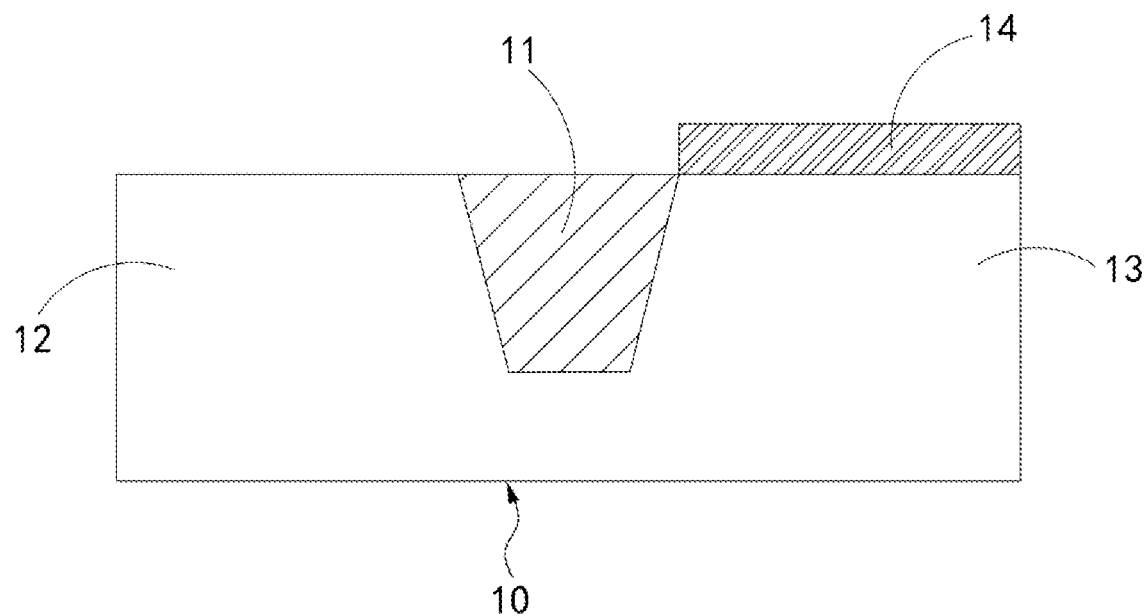
FIG. 3 is a schematic structural diagram of forming a substrate in a method of manufacturing a semiconductor structure according to an exemplary embodiment.

The substrate 10 with a PMOS using SiGe as a trench and an NMOS using Si as a trench is formed through selective epitaxy. As shown in FIG. 3, a SiGe layer 14 is located above the second active region 13.

In an embodiment, the first sidewall isolation layer 40 covers a sidewall of the first work function layer 22, so as to reliably block the diffusion of the metal elements.

In some embodiments, a gap may be formed between the first sidewall isolation layer 40 and the sidewall of the first work function layer 22, and other materials may be formed in the gap, or an air gap is directly formed. However, due to the presence of the first sidewall isolation layer 40, the metal elements can still be blocked.

In an embodiment, while the first initial work function layer is formed on the second dielectric layer 31, the first initial work function layer is also formed on the first dielectric layer 21, and before the formation of the first sidewall isolation layer 40 and/or the second sidewall isolation layer 50, the first initial work function layer on the first dielectric layer 21 is removed, such that the thickness of the subsequently formed first work function layer 22 is less than the thickness of the second work function layer 32.

It should be noted that, when the first initial work function layer is formed, the first initial work function layer may cover all the area above the substrate 10, but a part of the first initial work function layer that covers the first active region 12 and a part of the isolation structure 11 needs to be removed.

In an embodiment, the first sidewall isolation layer 40 and the second sidewall isolation layer 50 are formed in the same process step, so as to improve the manufacturing efficiency of the semiconductor structure and ensure the stability of the structure formation.

In an embodiment, forming the first sidewall isolation layer 40 and the second sidewall isolation layer 50 includes: forming an initial isolation layer 76 on the first dielectric layer 21 and the first initial work function layer; partially etching the initial isolation layer 76, and exposing a part of the first dielectric layer 21 and an upper surface of the first initial work function layer, so as to form the first sidewall isolation layer 40 and the second sidewall isolation layer 50. That is, the first sidewall isolation layer 40 is formed on a small section of the first dielectric layer 21, and the second sidewall isolation layer 50 covers the sidewall of the first initial work function layer, thereby blocking the metal elements.

In an embodiment, the first initial work function layer includes a first layer section and a second layer section. The first layer section is located above the isolation structure 11, and the second layer section is located on the second dielectric layer 31. The first layer section and the second layer section form a stepped structure, such that the initial isolation layer 76 is a stepped structure, and the first sidewall isolation layer 40 and the second sidewall isolation layer 50 formed after partial etching of the initial isolation layer 76 cover a sidewall of the first layer section and a sidewall of the second layer section respectively.

Figure 4:
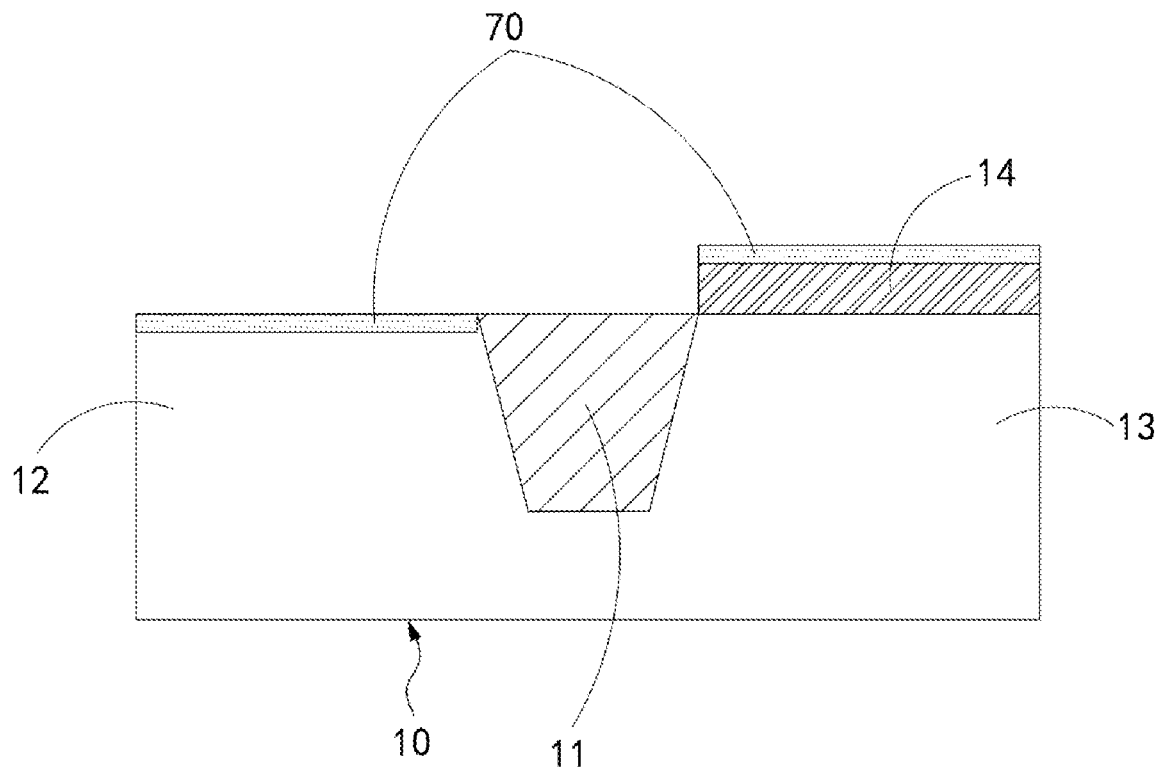
FIG. 4 is a schematic structural diagram of forming an interface layer in a method of manufacturing a semiconductor structure according to an exemplary embodiment.

In an embodiment, forming the first sidewall isolation layer 40 and the second sidewall isolation layer 50 includes:

An interface layer 70 is formed on the substrate 10. As shown in FIG. 4, in this case, the interface layer 70 covers the first active region 12 and the SiGe layer 14. Specifically, 3 slm to 5 slm of pure $O_2$ is introduced at the temperature of 900° C. to 1000° C. to implement high-temperature thermal oxidation, to in-situ generate an interface layer 70 having a thickness of 0.8 A to 1 nm within 10 s to 15 s.

Figure 5:
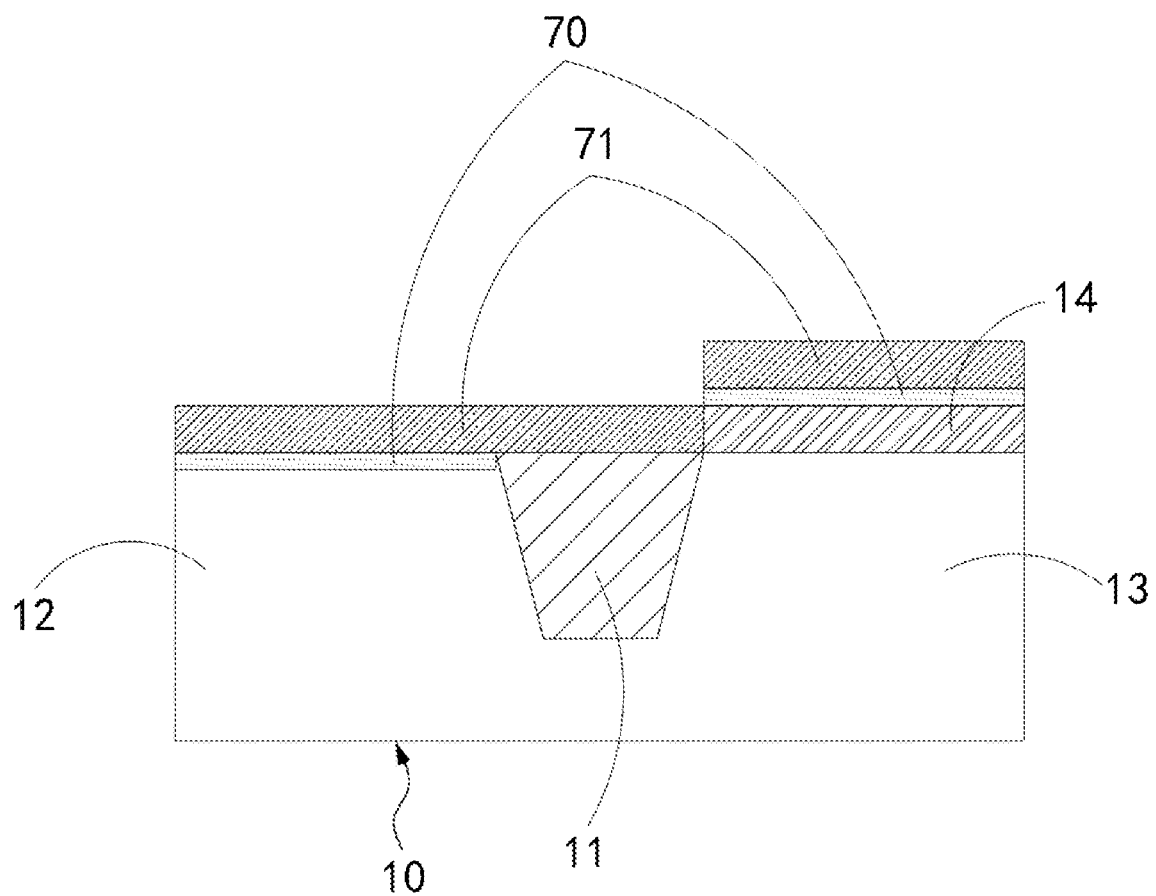
FIG. 5 is a schematic structural diagram of forming a high-k dielectric layer in a method of manufacturing a semiconductor structure according to an exemplary embodiment.

A high-k dielectric layer 71 is formed on the interface layer 70. As shown in FIG. 5, the high-k dielectric layer 71 covers the interface layer 70 and the isolation structure 11. Specifically, $HfO_2$ is grown as the high-k dielectric layer 71 through atomic layer deposition (ALD), and $HfCl_4$ is introduced as a precursor, to react with $H_2O$ at the temperature of 200° C. to 250° C. and under the working pressure of 1 to 2 torr, to generate $HfO_2$.

In this case, the interface layer 70 and the high-k dielectric layer 71 are used as the dielectric layer formed on the substrate 10. The interface layer 70 and the high-k dielectric layer 71 that are above the first active region 12, and the high-k dielectric layer 71 above a part of the isolation structure 11 are used as the first dielectric layer 21. The interface layer 70 and the high-k dielectric layer 71 above the second active region 13 are used as the second dielectric layer 31. The high-k dielectric layer 71 above a part of the isolation structure 11 is used as the third dielectric layer 61 of the isolation stacked structure 60.

Figure 6:
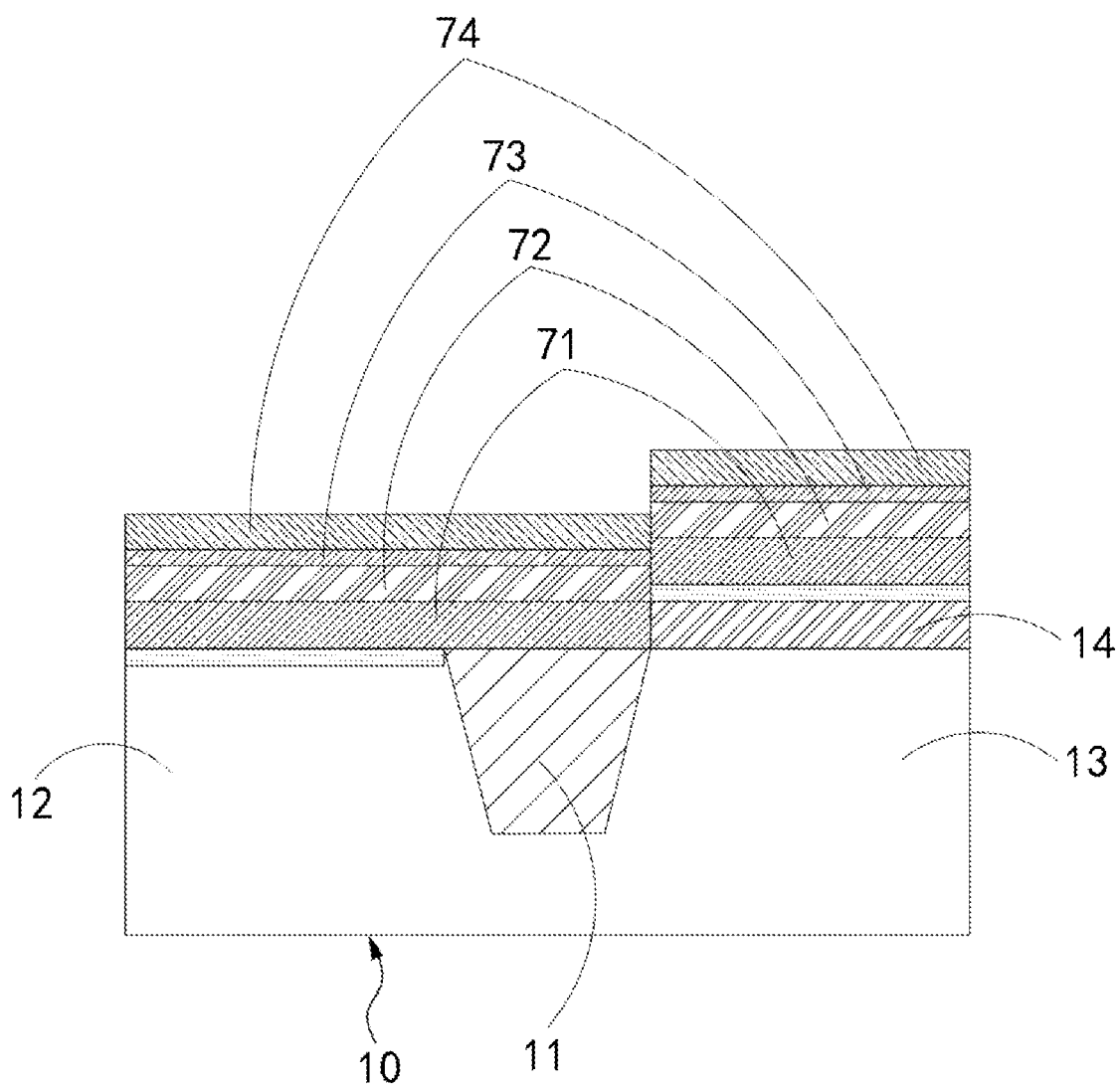
FIG. 6 is a schematic structural diagram of forming a metal isolation layer in a method of manufacturing a semiconductor structure according to an exemplary embodiment.

A stop layer 72 is formed on the high-k dielectric layer 71, a first transition metal layer 73 is formed on the stop layer 72, and a metal isolation layer 74 is formed on the first transition metal layer 73, as shown in FIG. 6. Specifically, a TiN layer is formed on the high-k dielectric layer 71 through ALD, that is, the stop layer 72 is formed. An Al layer is formed on the stop layer 72 through physical vapor deposition (PVD), that is, the first transition metal layer 73 is formed. Then, a TiN layer is formed on the first transition metal layer 73 through PVD, that is, a metal isolation layer 74 is formed.

In this case, the first initial work function layer is formed on both the first dielectric layer 21 and the second dielectric layer 31; the stop layer 72, the first transition metal layer 73, and the metal isolation layer 74 are used as the first initial work function layer.

Figure 7:
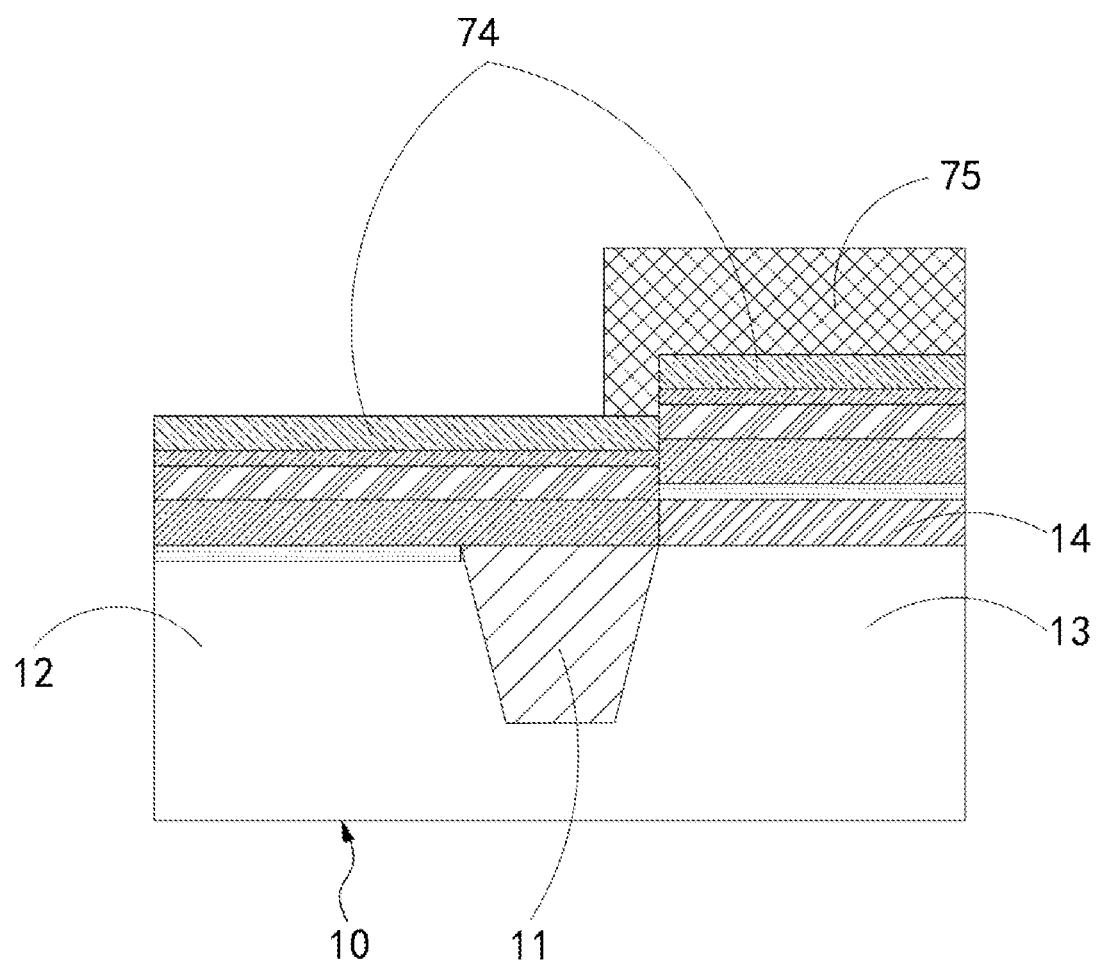
FIG. 7 is a schematic structural diagram of covering a mask structure in a method of manufacturing a semiconductor structure according to an exemplary embodiment.
Figure 8:
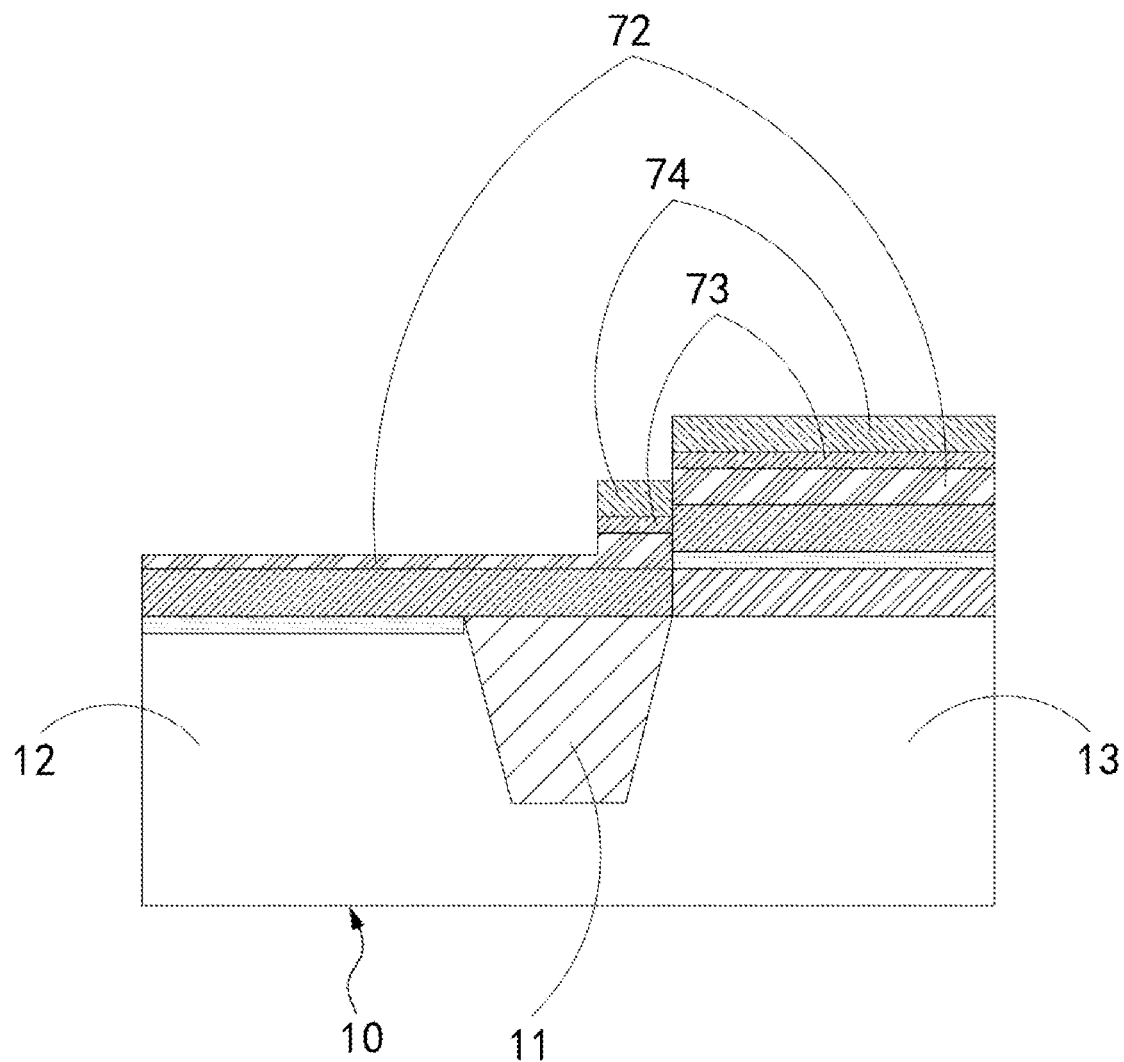
FIG. 8 is a schematic structural diagram of exposing a part of a stop layer in a method of manufacturing a semiconductor structure according to an exemplary embodiment.

The metal isolation layer 74 and the first transition metal layer 73 that are located above the first active region 12, and the metal isolation layer 74 and the first transition metal layer 73 that are located above a part of the isolation structure 11 are removed by using a mask structure 75. Specifically, as shown in FIG. 7, the mask structure 75 covers the area where the second active region 13 is located and the area where a part of the isolation structure 11 is located; the metal isolation layer 74 and the first transition metal layer 73 that are not covered by the mask structure 75 are removed by using photoetching and etching processes, and the stop layer 72 below the first transition metal layer 73 is used as a stop layer for etching (etch stop layer), thereby forming the structure shown in FIG. 8.

In addition, the stop layer 72, the first transition metal layer 73 and the metal isolation layer 74 that are located above a part of the isolation structure 11 are used as a first layer section of the first initial work function layer; the stop layer 72, the first transition metal layer 73 and the metal isolation layer 74 that are located above the second active region 13 are used as the second layer section of the first initial work function layer.

Figure 9:
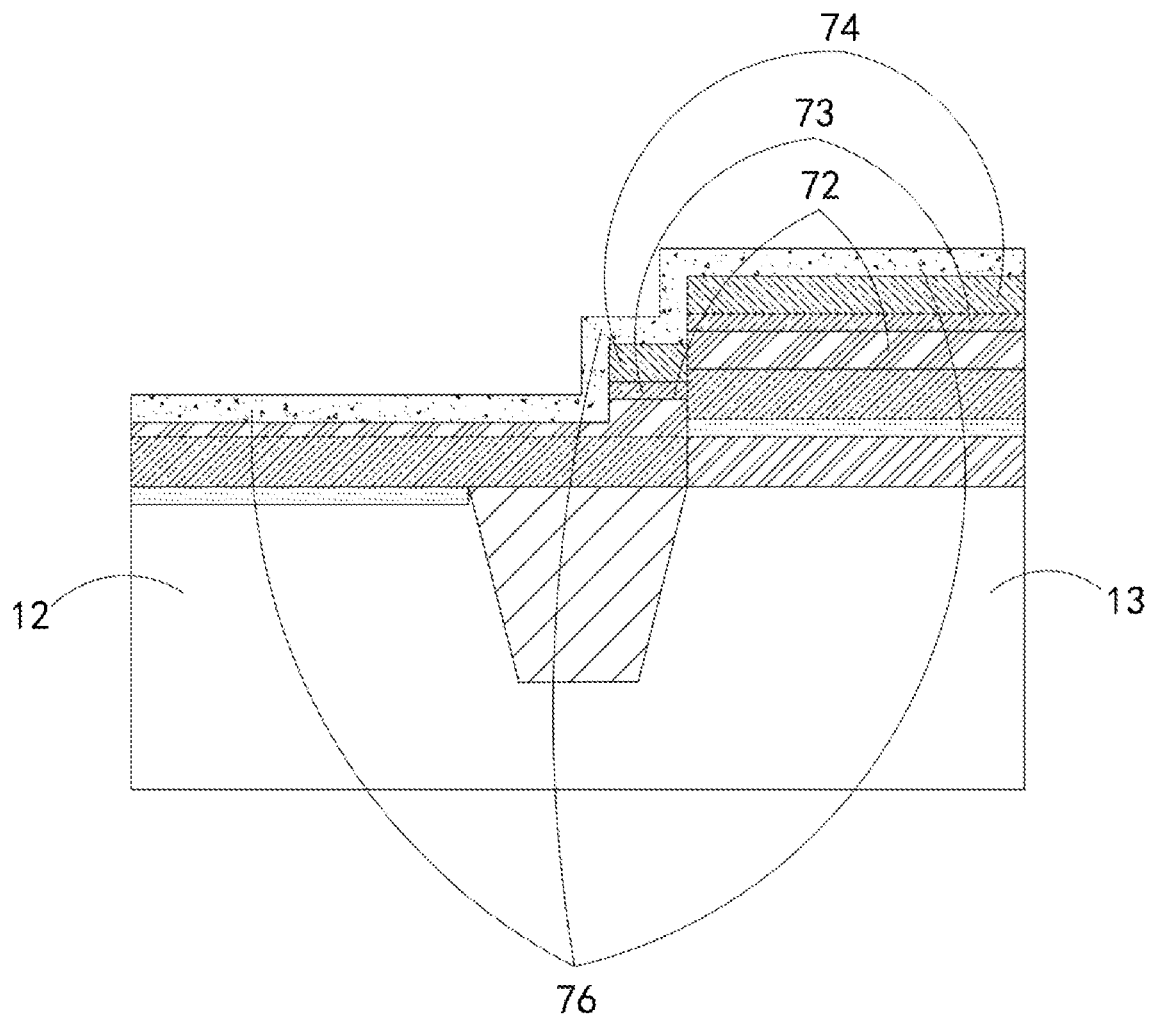
FIG. 9 is a schematic structural diagram of forming an initial isolation layer in a method of manufacturing method of a semiconductor structure according to an exemplary embodiment.

An initial isolation layer 76 is formed on the stop layer 72 and the metal isolation layer 74, and the initial isolation layer 76 covers sidewalls of the stop layer 72, the first transition metal layer 73, and the metal isolation layer 74, as shown in FIG. 9. Specifically, the initial isolation layer 76 is grown through ALD.

Figure 10:
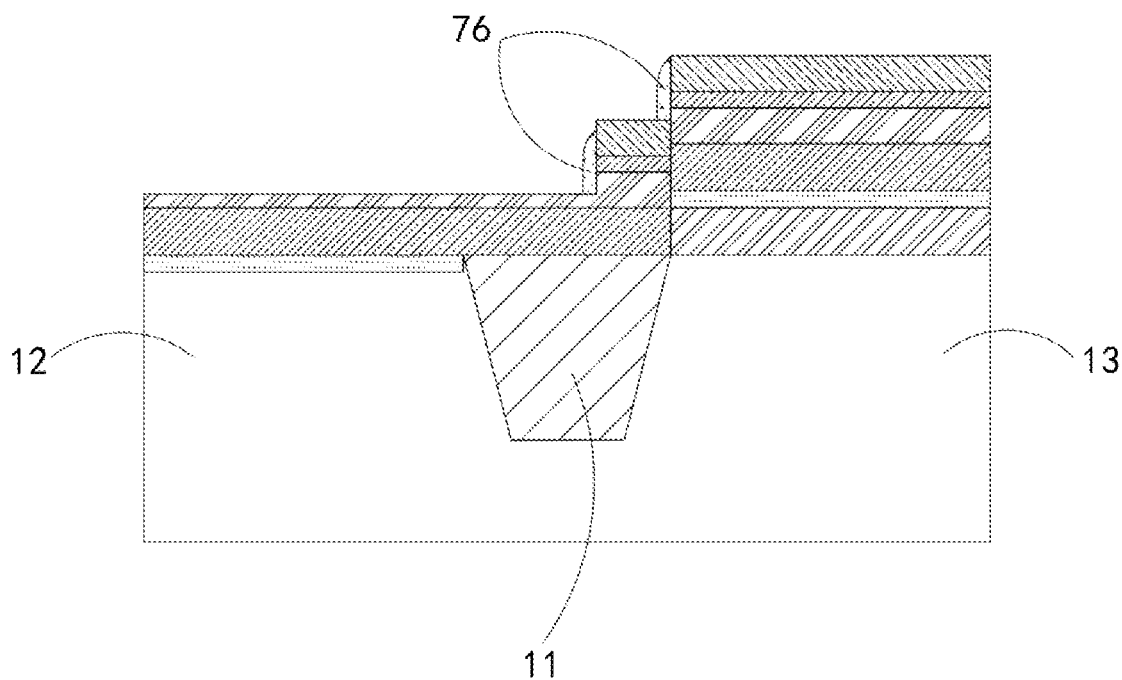
FIG. 10 is a schematic structural diagram of removing a part of an initial isolation layer in a method of manufacturing a semiconductor structure according to an exemplary embodiment.

The initial isolation layer 76 is partially etched to expose the stop layer 72 and the metal isolation layer 74. The initial isolation layer 76 covering the sidewalls of the stop layer 72, the first transition metal layer 73 and the metal isolation layer 74 that are located above the isolation structure 11 is used as the first sidewall isolation layer 40, and the initial isolation layer 76 covering the sidewalls of the stop layer 72, the first transition metal layer 73 and the metal isolation layer 74 that are located above the second active region 13 is used as the second sidewall isolation layer 50, as shown in FIG. 10. Specifically, dry etching is performed. $CF_4$, $C_2H_6$ and Ar are introduced. Under the effect of the fluorine base, the initial isolation layer 76 is reacted to generate $SiF_4$, which is removed in a vacuum environment.

Figure 11:
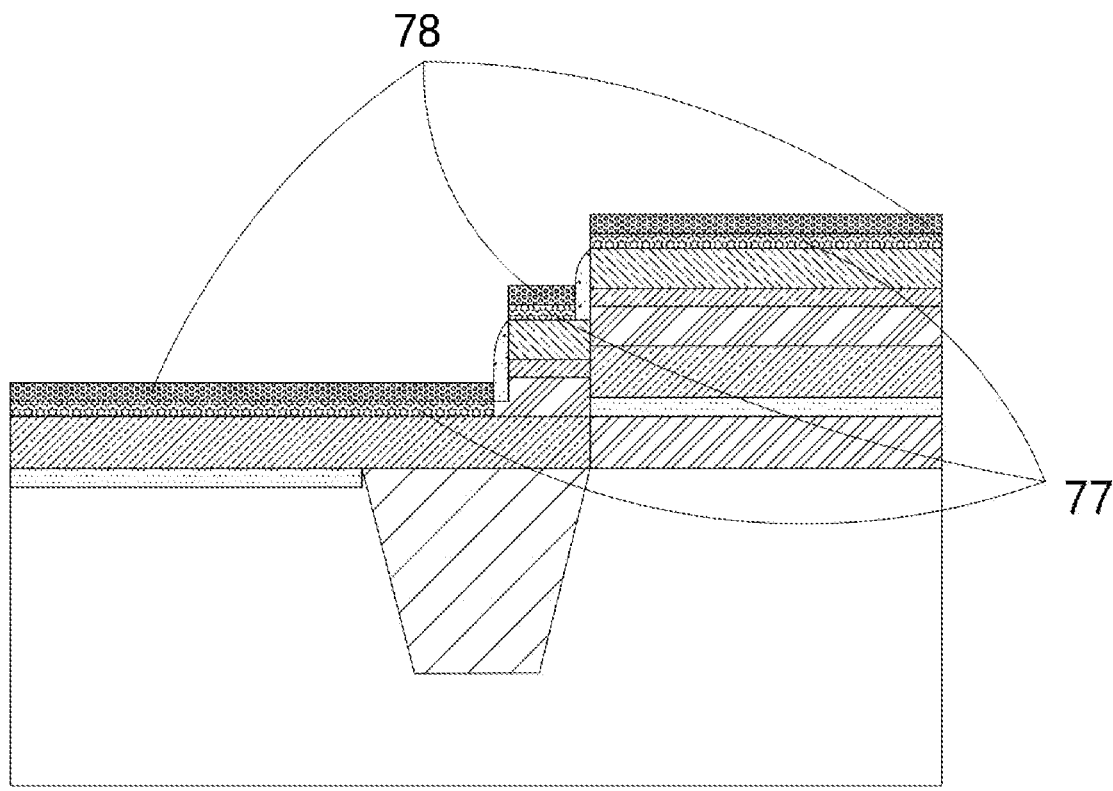
FIG. 11 is a schematic structural diagram of forming a barrier layer in a method of manufacturing a semiconductor structure according to an exemplary embodiment.
Figure 12:
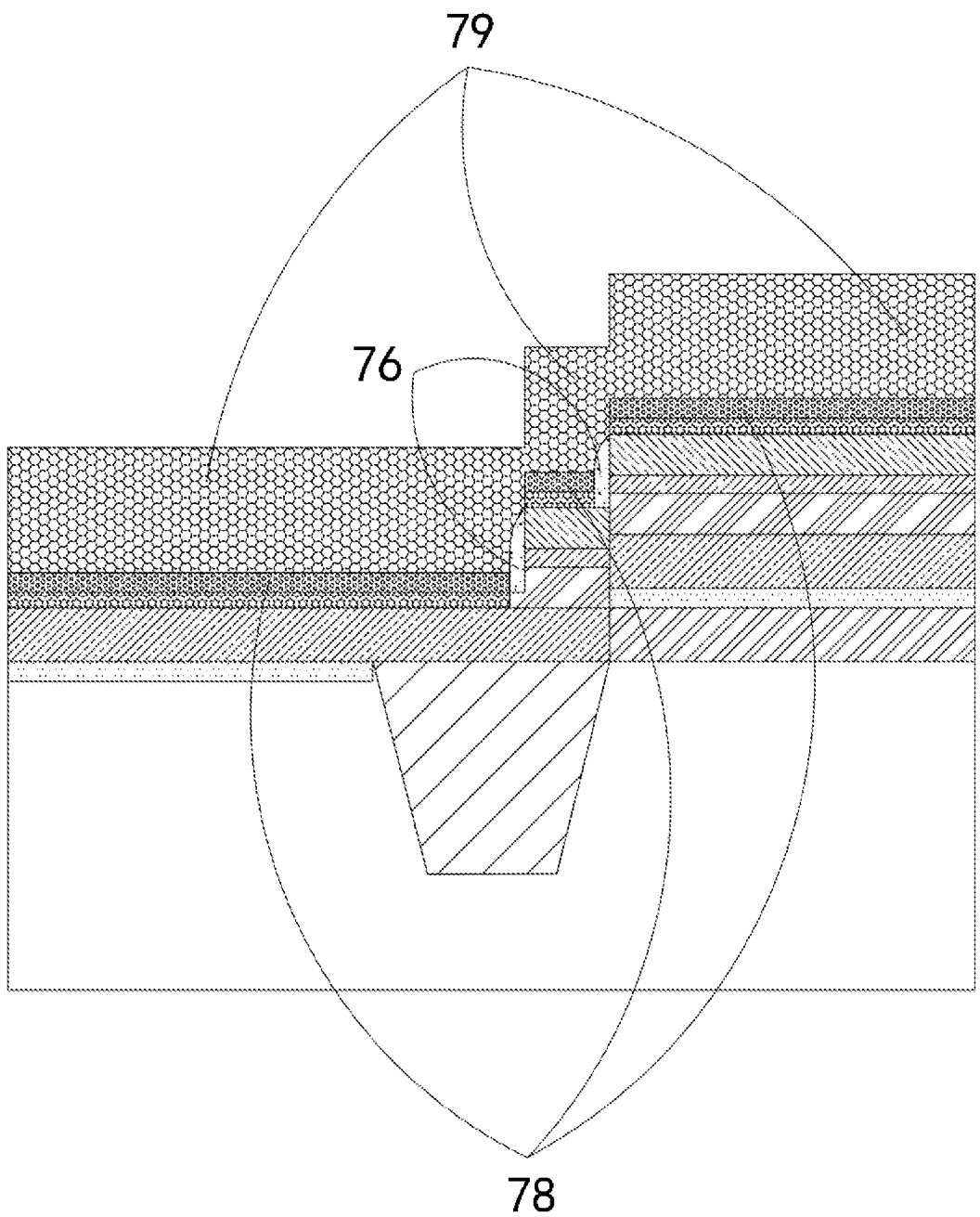
FIG. 12 is a schematic structural diagram of forming a polysilicon layer in a method of manufacturing a semiconductor structure according to an exemplary embodiment.
Figure 13:
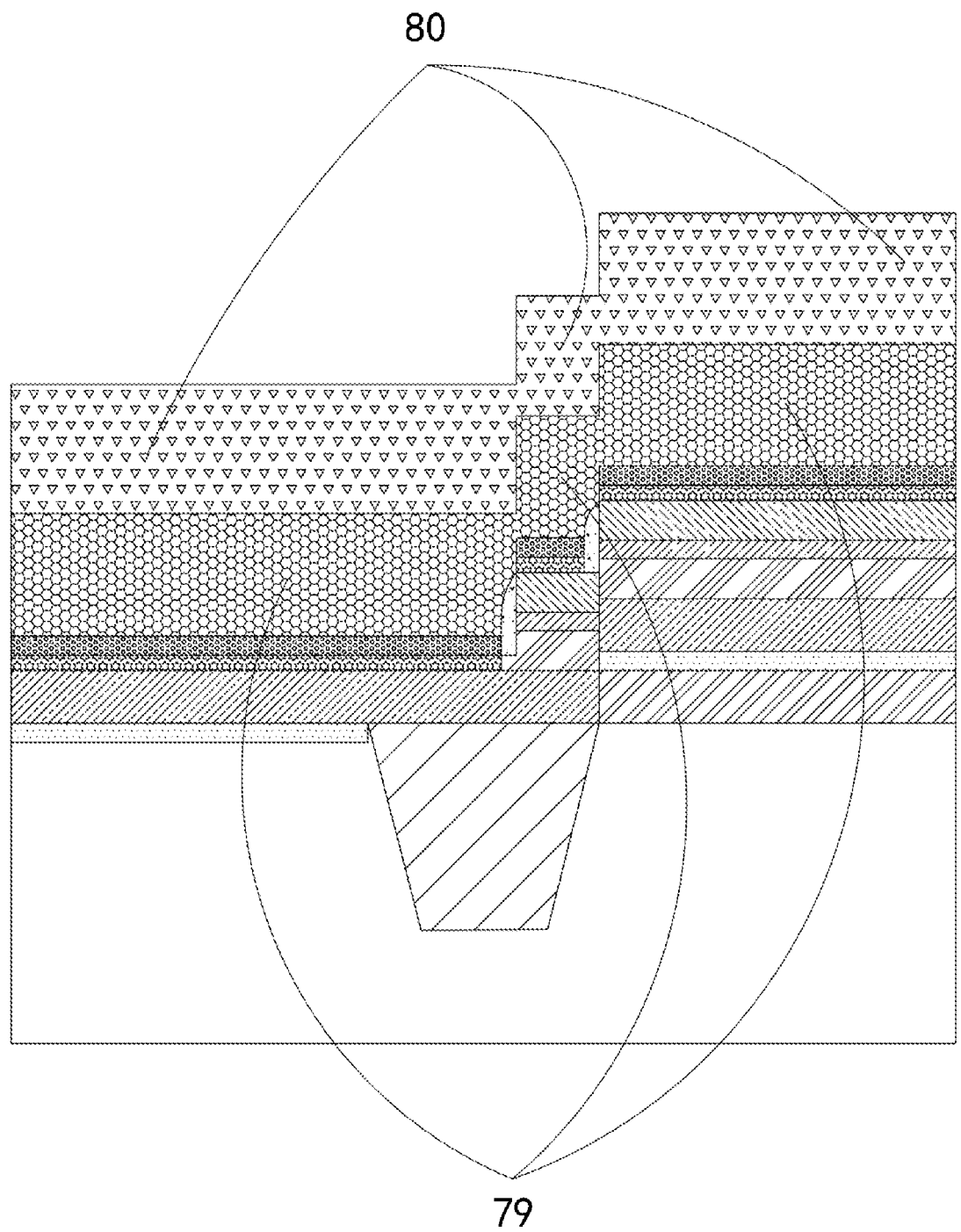
FIG. 13 is a schematic structural diagram of forming a metal layer in a method of manufacturing a semiconductor structure according to an exemplary embodiment.

In an embodiment, forming the NMOS transistor 20 and the PMOS transistor 30 on the substrate 10 includes: removing the exposed stop layer 72 after forming the first sidewall isolation layer 40 and the second sidewall isolation layer 50, and sequentially forming a second transition metal layer 77, a barrier layer 78, a polysilicon layer 79, and a metal layer 80 on the high-k dielectric layer 71 and the metal isolation layer 74. Specifically, the residual stop layer 72 is removed through wet etching; the second transition metal layer 77 and the barrier layer 78 are formed in sequence, as shown in FIG. 11; the polysilicon layer 79 as shown in FIG. 12 is formed, and finally, the metal layer 80 as shown in FIG. 13 is formed. The second transition metal layer 77 and the barrier layer 78 are used as the second initial work function layer. The polysilicon layer 79 and the metal layer 80 are used as the conductive layer formed above the substrate 10.

The second transition metal layer 77 and the barrier layer 78 above the first active region 12 and a part of the isolation structure 11 are used as the first work function layer 22; the polysilicon layer 79 and the metal layer 80 above the first active region 12 and a part of the isolation structure 11 are used as the first conductive layer 23.

The second transition metal layer 77 and the barrier layer 78 above the second active region 13 are used as the second initial work function layer. That is, the stop layer 72, the first transition metal layer 73, the metal isolation layer 74, the second transition metal layer 77, and the barrier layer 78 above the second active region 13 are used as the second work function layer 32; the polysilicon layer 79 and the metal layer 80 above the second active region 13 are used as the second conductive layer 33. The second initial work function layer and the first work function layer 22 include the same structure layers.

The stop layer 72, the first transition metal layer 73, the metal isolation layer 74, the second transition metal layer 77 and the barrier layer 78 located above a part of the isolation structure 11 are used as the third work function layer 62 of the isolation stacked structure 60; the polysilicon layer 79 and the metal layer 80 located above a part of the isolation structure 11 are used as the third conductive layer 63 of the isolation stacked structure 60.

It should be noted that, for the materials of the structural layers appearing in the method of manufacturing a semiconductor structure, reference may be made to the foregoing semiconductor structure, and details are not described herein again.

In an embodiment, the method of manufacturing a semiconductor structure further includes: removing the isolation stacked structure 60, to form an NMOS transistor 20 and a PMOS transistor 30 that are independent of each other, such that the isolation structure 11 is completely exposed.

In an embodiment, the method of manufacturing a semiconductor structure is used for forming the foregoing semiconductor structure.

The semiconductor structure adopts the solution of the ALD oxide spacer (that is, the solution of forming the first sidewall isolation layer 40 and the second sidewall isolation layer 50), cross diffusion of work function metal layers of the semiconductor structure can be prevented, thereby improving the work function adjusting capability of the semiconductor structure.

Those skilled in the art may easily figure out other implementations of the present disclosure after considering the specification and practicing the implementation disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and implementations are merely considered as illustrative, and the real scope and spirit of the present disclosure are directed by the appended claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

The invention claimed is:

1. A semiconductor structure, comprising a substrate, and an N-channel metal-oxide semiconductor (NMOS) transistor and a P-channel metal-oxide semiconductor (PMOS) transistor that are located on the substrate, wherein
the NMOS transistor comprises:
a first dielectric layer, located on the substrate;
a first work function layer, located on the first dielectric layer; and
a first conductive layer, located on the first work function layer; and
the PMOS transistor comprises:
a second dielectric layer, located on the substrate;
a second work function layer, located on the second dielectric layer; and
a second conductive layer, located on the second work function layer;
the first work function layer is provided with a first sidewall isolation layer on a side facing the second work function layer,
the second work function layer is provided with a second sidewall isolation layer on a side facing the first work function layer; and
the first sidewall isolation layer is located below the second sidewall isolation layer.

2. The semiconductor structure according to claim 1, wherein the first sidewall isolation layer and the second sidewall isolation layer are spaced apart.

3. The semiconductor structure according to claim 1, wherein at least one of:
a bottom of the first sidewall isolation layer is higher than a bottom of the first work function layer;
a top of the first sidewall isolation layer is higher than a top of the first work function layer to cover a sidewall of the first conductive layer;
a bottom of the second sidewall isolation layer is higher than a bottom of the second work function layer; or
a top of the second sidewall isolation layer is lower than a top of the second work function layer.

4. The semiconductor structure according to claim 1, wherein an isolation structure is formed in the substrate, so as to separate a first active region and a second active region in the substrate for the NMOS transistor and the PMOS transistor respectively;
wherein at least one of the NMOS transistor or the PMOS transistor covers a part of the isolation structure.

5. The semiconductor structure according to claim 4, further comprising:
an isolation stacked structure, located above the isolation structure and between the NMOS transistor and the PMOS transistor;
wherein at least one of the first sidewall isolation layer is located between the NMOS transistor and the isolation stacked structure, or the second sidewall isolation layer is located between the PMOS transistor and the isolation stacked structure.

6. The semiconductor structure according to claim 5, wherein the isolation stacked structure comprises:
a third dielectric layer, located on the isolation structure;
a third work function layer, located on the third dielectric layer; and
a third conductive layer, located on the third work function layer;
wherein the first sidewall isolation layer covers a sidewall of the third work function layer, and the second sidewall isolation layer covers a sidewall of the third work function layer.

7. The semiconductor structure according to claim 6, wherein at least one of:
a bottom of the first sidewall isolation layer is higher than a bottom of the third work function layer, and a top of the first sidewall isolation layer is lower than a top of the third work function layer; or
a bottom of the second sidewall isolation layer is higher than the bottom of the third work function layer, and a top of the second sidewall isolation layer is higher than the top of the third work function layer, to cover a sidewall of the third conductive layer.

8. The semiconductor structure according to claim 5, wherein at least one of:
the substrate is a stepped structure, such that a top of the second dielectric layer is higher than a top of the first dielectric layer; or
the NMOS transistor, the isolation stacked structure and the PMOS transistor form a stepped structure.

9. The semiconductor structure according to claim 1, wherein the first sidewall isolation layer and the second sidewall isolation layer are oxide layers.

10. The semiconductor structure according to claim 1, wherein the first sidewall isolation layer has a width of 3 nm to 5 nm, and the second sidewall isolation layer has a width of 3 nm to 5 nm.

11. The semiconductor structure according to claim 1, wherein the NMOS transistor and the PMOS transistor form a stepped structure.

12. The semiconductor structure according to claim 1, wherein an isolation structure is formed in the substrate, so as to separate a first active region and a second active region in the substrate for the NMOS transistor and the PMOS transistor respectively.

13. The semiconductor structure according to claim 1, wherein a number of films of the first work function layer is not greater than a number of films of the second work function layer.

14. A method of manufacturing a semiconductor structure, comprising:
providing a substrate, wherein an isolation structure is formed in the substrate to separate a first active region and a second active region;
forming a dielectric layer, wherein the dielectric layer above the first active region is used as a first dielectric layer, and the dielectric layer above the second active region is used as a second dielectric layer, and forming a first initial work function layer on the second dielectric layer;
forming a first sidewall isolation layer on a side of the first dielectric layer close to the second dielectric layer, and forming a second sidewall isolation layer on a sidewall of the first initial work function layer close to the first dielectric layer;

forming a second initial work function layer, wherein the second initial work function layer on the first dielectric layer is used as a first work function layer, the first initial work function layer and the second initial work function layer on the first initial work function layer are used as a second work function layer; and forming a conductive layer, wherein the conductive layer on the first work function layer is used as a first conductive layer, and the conductive layer on the second work function layer is used as a second conductive layer;

wherein the first sidewall isolation layer covers a sidewall of the first work function layer, the first sidewall isolation layer and the second sidewall isolation layer are formed in a same process step, and the forming the first sidewall isolation layer and forming the second sidewall isolation layer comprises:

forming an initial isolation layer on the first dielectric layer and the first initial work function layer; and partially etching the initial isolation layer, and exposing a part of the first dielectric layer and an upper surface of the first initial work function layer, so as to form the first sidewall isolation layer and the second sidewall isolation layer.

15. The method of manufacturing the semiconductor structure according to claim 14, wherein while the first initial work function layer is formed on the second dielectric layer, the first initial work function layer is also formed on the first dielectric layer, and before at least one of the first sidewall isolation layer or the second sidewall isolation layer is formed, the first initial work function layer on the first dielectric layer is removed.

16. The method of manufacturing the semiconductor structure according to claim 14, wherein the first initial work function layer comprises a first layer section and a second layer section; the first layer section is located above the isolation structure, and the second layer section is located above the second dielectric layer; the first layer section and the second layer section form a stepped structure, such that the initial isolation layer is a stepped structure, and the first sidewall isolation layer and the second sidewall isolation layer formed after partial etching the initial isolation layer cover a sidewall of the first layer section and a sidewall of the second layer section respectively.

17. A semiconductor structure, comprising a substrate, and an NMOS transistor and a PMOS transistor that are located on the substrate, wherein the NMOS transistor comprises:
a first dielectric layer, located on the substrate;
a first work function layer, located on the first dielectric layer; and
a first conductive layer, located on the first work function layer; and the PMOS transistor comprises:
a second dielectric layer, located on the substrate;
a second work function layer, located on the second dielectric layer; and
a second conductive layer, located on the second work function layer;

at least one of:
the first work function layer is provided with a first sidewall isolation layer on a side facing the second work function layer, or
the second work function layer is provided with a second sidewall isolation layer on a side facing the first work function layer, an isolation structure is formed in the substrate, so as to separate a first active region and a second active region in the substrate for the NMOS transistor and the PMOS transistor respectively, and at least one of the NMOS transistor or the PMOS transistor covers a part of the isolation structure.

* * * * *